United States Patent
Nakagawa et al.

(10) Patent No.: US 8,633,577 B2
(45) Date of Patent: Jan. 21, 2014

(54) INTEGRATED CIRCUIT DEVICE

(75) Inventors: Yoshihiro Nakagawa, Tokyo (JP); Muneo Fukaishi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 681 days.

(21) Appl. No.: 12/162,059

(22) PCT Filed: Jan. 16, 2007

(86) PCT No.: PCT/JP2007/050490
§ 371 (c)(1),
(2), (4) Date: Jul. 24, 2008

(87) PCT Pub. No.: WO2007/086278
PCT Pub. Date: Aug. 2, 2007

(65) Prior Publication Data
US 2009/0014892 A1    Jan. 15, 2009

(30) Foreign Application Priority Data
Jan. 24, 2006   (JP) .................................. 2006-015543

(51) Int. Cl.
*H01L 23/52* (2006.01)

(52) U.S. Cl.
USPC .......................................... 257/686; 257/777

(58) Field of Classification Search
USPC ................................................ 257/686, 777
See application file for complete search history.

(56) References Cited

U.S. PATENT DOCUMENTS

| | | | |
|---|---|---|---|
| 5,629,553 A | 5/1997 | Ikeda et al. | |
| 5,701,037 A | 12/1997 | Weber et al. | |
| 6,388,636 B1 * | 5/2002 | Brown et al. | 343/866 |
| 2005/0024178 A1 | 2/2005 | Ancy et al. | |
| 2005/0122699 A1 * | 6/2005 | Maeda et al. | 361/793 |
| 2005/0194168 A1 * | 9/2005 | Tonomura et al. | 174/35 R |
| 2007/0194427 A1 * | 8/2007 | Choi et al. | 257/686 |

FOREIGN PATENT DOCUMENTS

| | | |
|---|---|---|
| JP | 7142258 | 6/1995 |
| JP | 7221260 | 8/1995 |
| JP | 845744 | 2/1996 |
| JP | 8236696 | 9/1996 |
| JP | 10200007 | 7/1998 |
| JP | 200124413 | 1/2001 |
| JP | 200557270 | 3/2005 |

* cited by examiner

Primary Examiner — Howard Weiss
Assistant Examiner — Tifney Skyles
(74) Attorney, Agent, or Firm — Sughrue Mion, PLLC

(57) ABSTRACT

Provided on a chip are a plurality of conductor patterns for forming a coil, and a connection-relationship control device for controlling connection between adjacent conductor patterns. By switching the connection relationship of the conductor patterns by the connection-relationship control device, it is possible to form a coil of a desired shape at a desired position.

4 Claims, 24 Drawing Sheets

FIG.3A 4 SWITCH 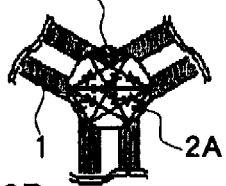 FIG.3H 
1   2A
FIG.3B 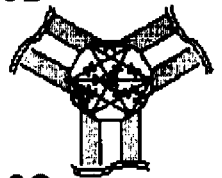 FIG.3I 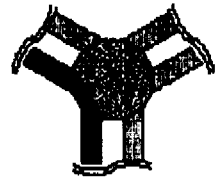
FIG.3C 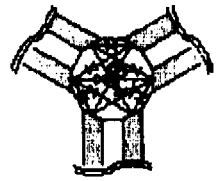 FIG.3J 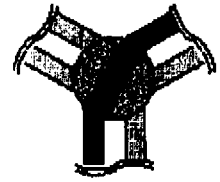
FIG.3D 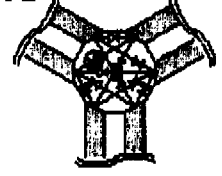 FIG.3K 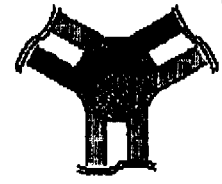
FIG.3E 4 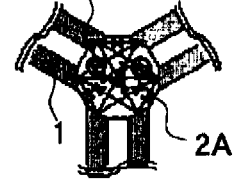 FIG.3L 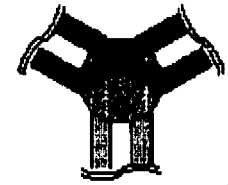
1   2A
FIG.3F 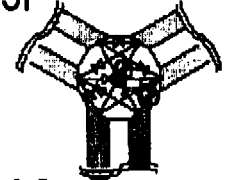 FIG.3M 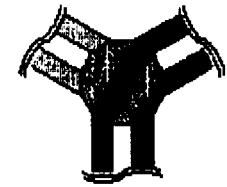
FIG.3G 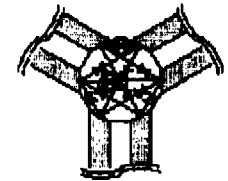 FIG.3N 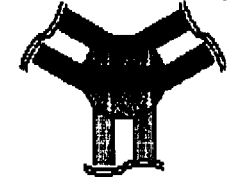

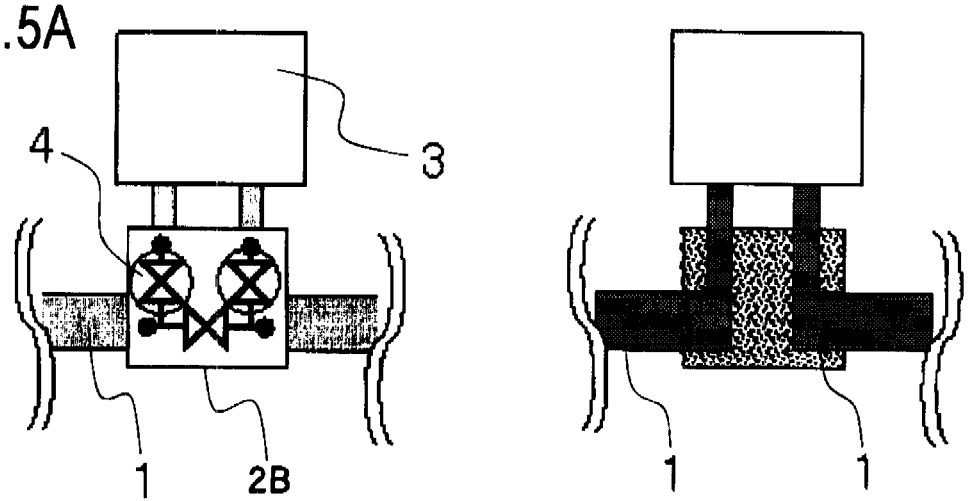
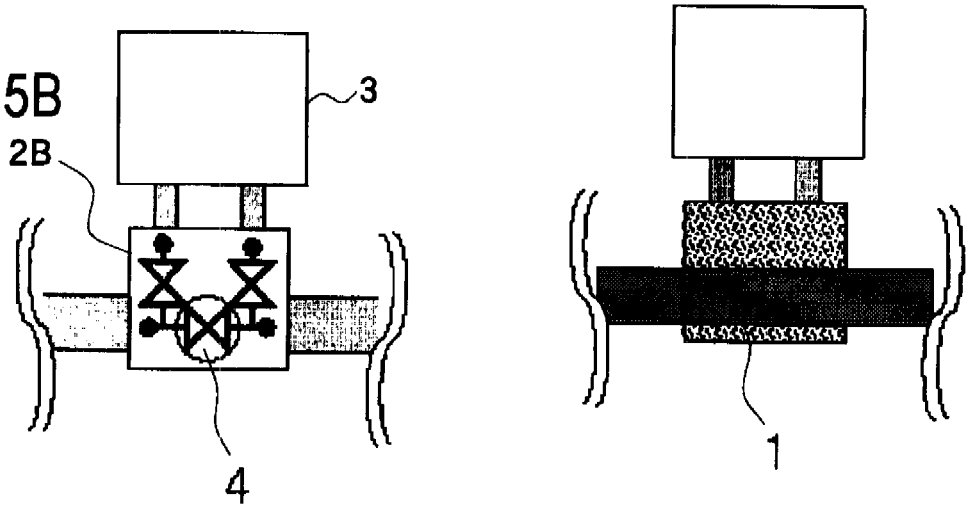

FIG.17A
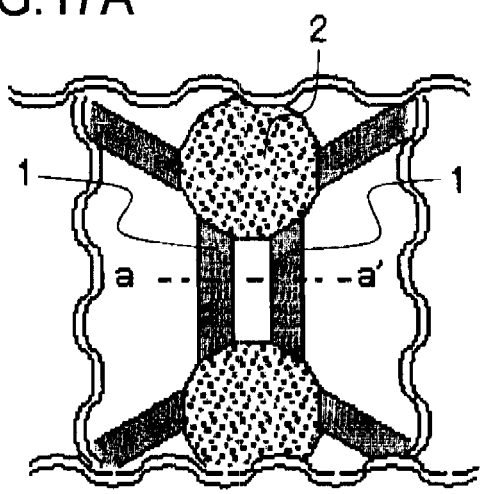
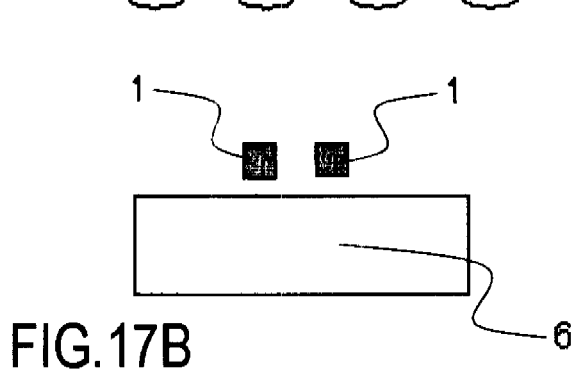
FIG.17B
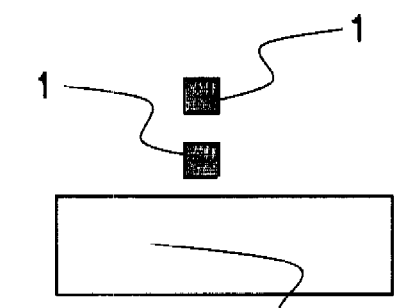
FIG.17C

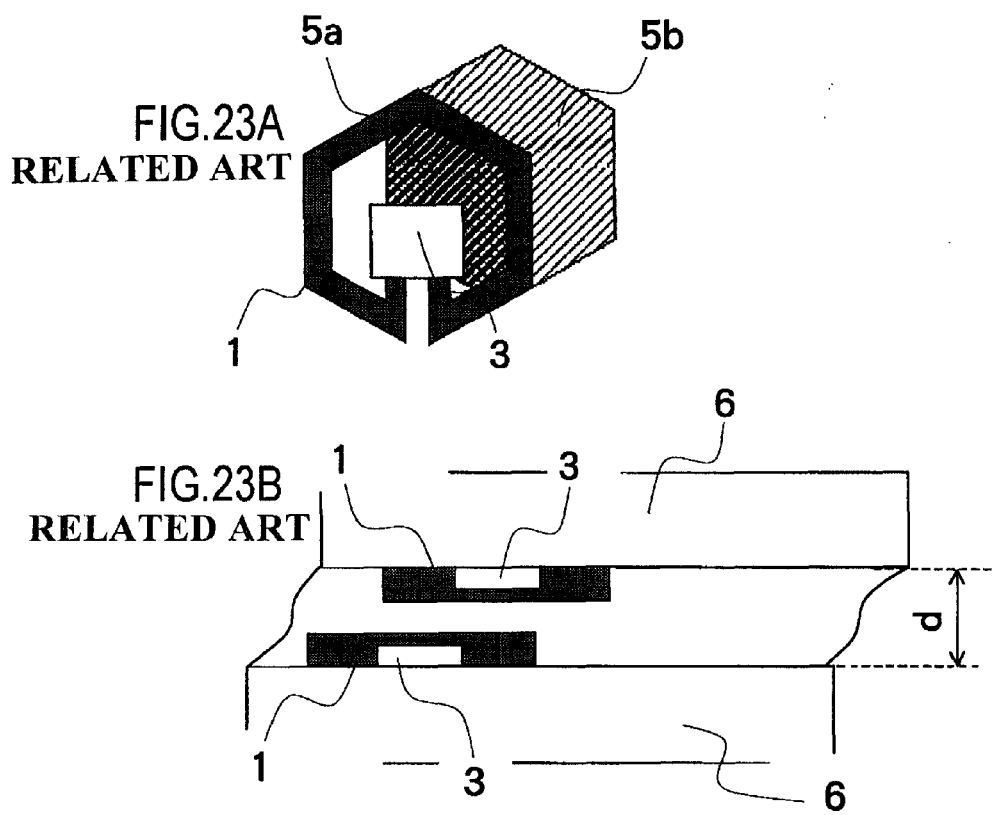

INTEGRATED CIRCUIT DEVICE

TECHNICAL FIELD

This invention relates to an integrated circuit device in which signal transmission is performed utilizing electromagnetic coupling by electromagnetic induction coils between chips stacked in the vertical direction.

BACKGROUND ART

Progress in microfabrication techniques applied in recent semiconductor manufacturing processes has been accompanied by higher integration of circuits incorporated in integrated circuit devices. However, there has been little technological advance with regard to the spacing of I/O (input/output) pads of the chip. As a consequence, the area occupied by the I/O portions is large and this has become a major obstacle to higher integration of integrated circuit devices.

Accordingly, in recent years an integrated circuit device has been developed in which chips on which electromagnetic induction coils have been formed are stacked vertically and signal transmission is performed using opposing electromagnetic induction coils between chips (see Patent Documents 1 to 3). FIG. 21A is a planar projection of a conventional integrated circuit device in which signal transmission is performed using electromagnetic induction coils, and FIG. 21B is a sectional view thereof. This integrated circuit device is obtained by stacking chips 6 in the vertical direction and securing the chips to each other by an adhesive layer 7. Formed on the opposing faces of the chips 6 are respective conductor patterns 1 that operate as electromagnetic induction coils, and signal devices 3 that receive a current signal generated in the respective coil or that supply a current signal to the coil.

The device will be described assuming that the coil and signal device placed on the upper chip are for transmission and the coil and signal device placed on the lower chip are for reception. Current is supplied to the transmitting coil from the signal device in a direction that depends upon the transmit signal. For example, if we let "1" be a current signal in the clockwise direction as seen from the top surface of the chip, then the transmitting coil generates a magnetic flux in a direction that penetrates through the receiving coil from the top down. An induced current flows into the receiving coil owing to the magnetic flux that has penetrated through the interior of the coil. At this time the direction of the induced current is the same as the direction of the current supplied to the transmitting coil. By using the signal device to measure the induced current produced or an electric signal such as a voltage obtained by conversion, signal transmission is completed.

If it is desired to transmit a "0" signal, then a current is supplied to the transmitting coil in the counter-clockwise direction, which is opposite the direction in the case of "1", thereby making it possible to transmit the "0" signal.

In general, a signal transmission system using the electromagnetic coupling of electromagnetic induction coils is such that the area occupied by the I/O portions is smaller that of a packaging system using area bumps, thus making it possible to raise the packing density of integrated circuits.

[Patent Document 1] Japanese Patent Application Laid-Open No. 7-221260

[Patent Document 2] Japanese Patent Application Laid-Open No. 8-236696

[Patent Document 1] Japanese Patent Application Laid-Open No. 10-200007

DISCLOSURE OF THE INVENTION

Problems to be Solved by the Invention

In the above-described signal transmission system, a current is supplied to a transmitting coil fabricated on a chip, an electric signal is induced in a receiving coil formed on a chip separate from the chip on which the transmitting coil is formed, and the signal is measured and transferred. In order to perform high-quality transmission such as high-speed signal transmission or low error rate in this transmission system, therefore, the signal induced in the receiving coil must be enlarged to assure a good S/N ratio. The signal induced in this receiving coil is proportional to the mutual inductance between the transmitting and receiving coils.

This mutual inductance is proportional to self-inductance of the receiving coil self-inductance of the transmitting coil and the coupling coefficient between the coils. The coupling coefficient depends upon relative positions of the coils and a distance between the coils. In order to realize high-quality signal transmission, therefore, it is required that the positions of the electromagnetic induction coils formed on the respective chips and the distance between them be adjusted with an extremely high degree of precision.

If it is assumed that the distance between coils shifts from a desired distance d, as illustrated in FIG. 22, the mutual inductance declines and sufficient signal strength is no longer obtained.

Further, if the positions of the opposing coils shift in the horizontal direction, as illustrated in FIG. 23, mutual inductance decreases and signal strength declines. Moreover, if another coil is present at an adjacent position, as depicted in FIG. 24, malfunction occurs owing to the influence of the neighboring coil.

When one chip is mounted on another, it is very difficult to align the chips horizontally and to set the distance between the chips with a high degree of precision. Moreover, since coil position and mutual inductance cannot be changed after chip packaging with the conventional method of manufacture, transmission speed is limited and the error rate cannot be lowered sufficiently.

Furthermore, when a resonance frequency departs from the design value owing to effects of variations in parasitic resistance and parasitic capacitance in the coil manufacturing process, the resonance frequency cannot be changed after the coil is manufactured. This makes efficient signal transmission difficult.

An object of the present invention is to solve the foregoing problems and provide an integrated circuit device that does not require highly accurate position alignment at the time of chip packaging and in which relative positions of coils, mutual inductance and resonance frequency can be changed after a chip packaging process. A further object of the present invention is to provide a method of deciding coil positions and mutual inductance suitable for signal transmission.

Means for Solving the Problems

An integrated circuit device according to the present invention is such that a plurality of substrates on which coils have been formed are stacked, and signal transmission is performed by electromagnetic coupling between opposing coils. This integrated circuit device includes: a number of conductor patterns disposed on each substrate; and a connection control device for controlling connection between end portions of the conductor patterns. Each coil is formed by connecting desired ones of the number of conductor patterns into a loop using the connection control device.

With such an arrangement, the conductors comprising the conductor patterns connected by the connection control devices become a coil relating to signal transmission. Therefore, by selecting the connection relationship of the conductor patterns by means of the connection control devices after the substrates are stacked, it becomes possible to change the position of the coil. Further, since the length and number of windings of the conductors that form the coil can also be changed depending upon the connection relationship, it is possible to change mutual inductance and resonance frequency as well.

A semiconductor device according to the present invention is such that a plurality of polygons are arranged, with vertices thereof serving as lattice points, so as to fill in completely a two-dimensional area for inductor formation; a side connecting adjacent lattice points is provided with at least one conductor disposed along this side, and each lattice point is provided with a plurality of switches for on/off control of connections between conductors on a plurality of sides that meet at the lattice point; one side of each polygon is provided with a switch for controlling whether or not the conductor disposed along this side is connected to a signal device that performs reception and/or supply of a current signal; and a planar inductor of any shape and size is freely constructed within the two-dimensional area by controlling on/off action of each of the switches. In the present invention, one side of the polygon includes, as the conductor along this side, a first conductor portion and a second conductor portion each having first ends opposing each other and each having second ends that extend to respective ones of two vertices at both ends of this side; and the semiconductor device further includes first and second switches for on/off control of connections between the first end of the first conductor portion and the signal device that performs reception and/or supply of a current signal and the first end of the second conductor portion and the signal device that performs reception and/or supply of a current signal, respectively; and a third switch for on/off control of the connection between the opposing first ends of the first conductor portion and second conductor portion. In the present invention, the polygons include polygons of one type or of a plurality of types and can fill a two-dimensional plane.

Effects of the Invention

In accordance with the present invention, it is possible to freely change coil position, mutual inductance and resonance frequency after chip packaging. This makes it possible to realize high-quality signal transmission.

BRIEF DESCRIPTION OF THE DRAWINGS

FIG. 3 shows schematic views illustrating respective states of connection between conductor patterns by switches in the connection-relationship control device 2A shown in FIG. 2;

FIG. 5 shows schematic views illustrating respective states of connection between conductor patterns and a signal device by switches in the connection-relationship control device 213 shown in FIG. 4;

FIG. 17 is a diagram illustrating a coil conductor portion based upon a case where a single wiring layer is used and a coil conductor portion based upon a case where a plurality of wiring layers are used;

FIG. 23 is a planar projection and sectional view of an integrated circuit device according to the prior art in a case where a chip has shifted in the horizontal direction.

Figure 1:
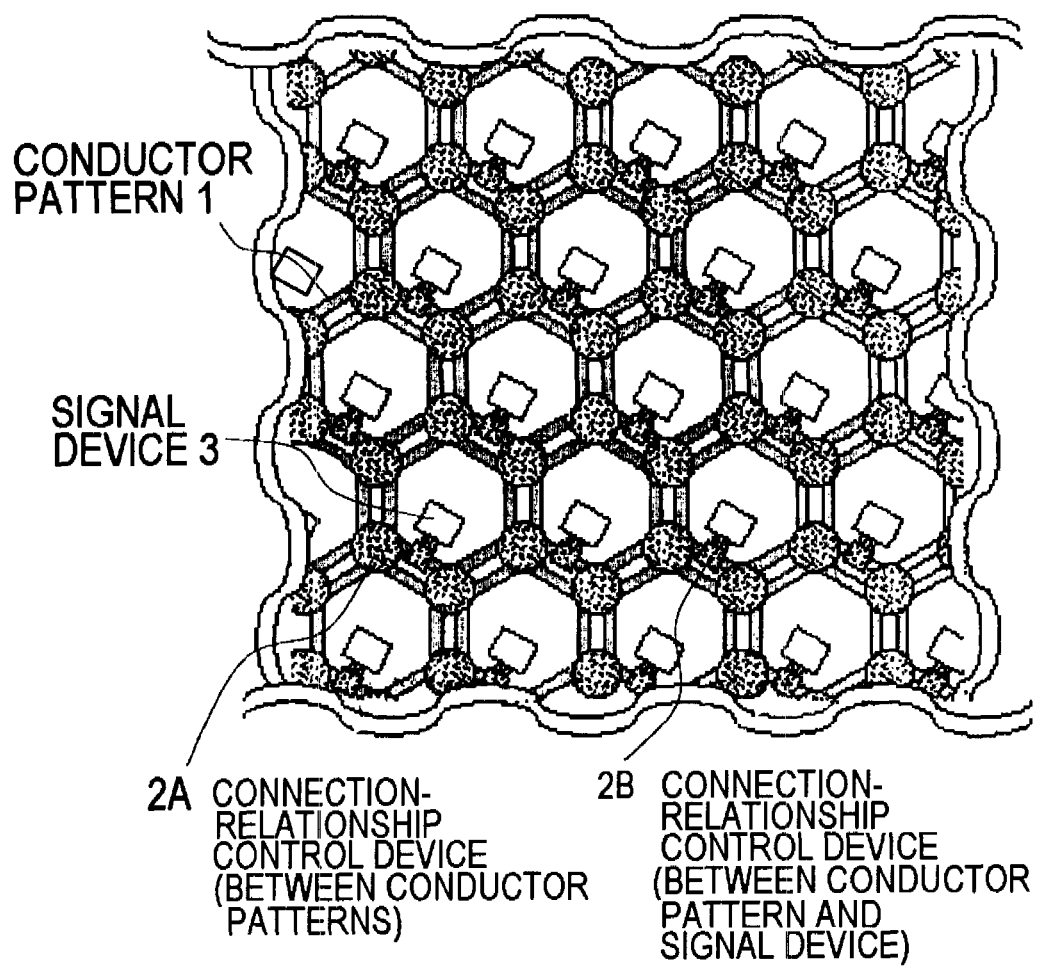
FIG. 1 is schematic planar view of a chip constituting an integrated circuit device according to an embodiment of the present invention.

DESCRIPTION OF REFERENCE CHARACTERS 1 conductor pattern
2A first connection-relationship control device
2B first connection-relationship control device
3 signal device
4 switch 5 area in which receiving coil has been projected upon chip having transmitting coil
6 chip
7 adhesive layer

BEST MODE FOR CARRYING OUT THE INVENTION

Next, an embodiment of the present invention will be described based upon the drawings.

FIG. 1 is schematic planar view of a chip constituting an integrated circuit device according to an embodiment of the present invention. As illustrated in FIG. 1, a plurality of conductor patterns 1 for forming a coil, connection-relationship control devices 2A and 2B and a signal device 3 basically are formed on a surface layer or inner layer of a chip, which serves as a semiconductor substrate. The signal device 3 receives a current signal generated in a coil, or supplies a current signal to the coil, or does both. The integrated circuit device according to the present invention is obtained by stacking such chips in the vertical direction and performs signal transmission by electromagnetic coupling between opposing coils of the chips.

Figure 2:
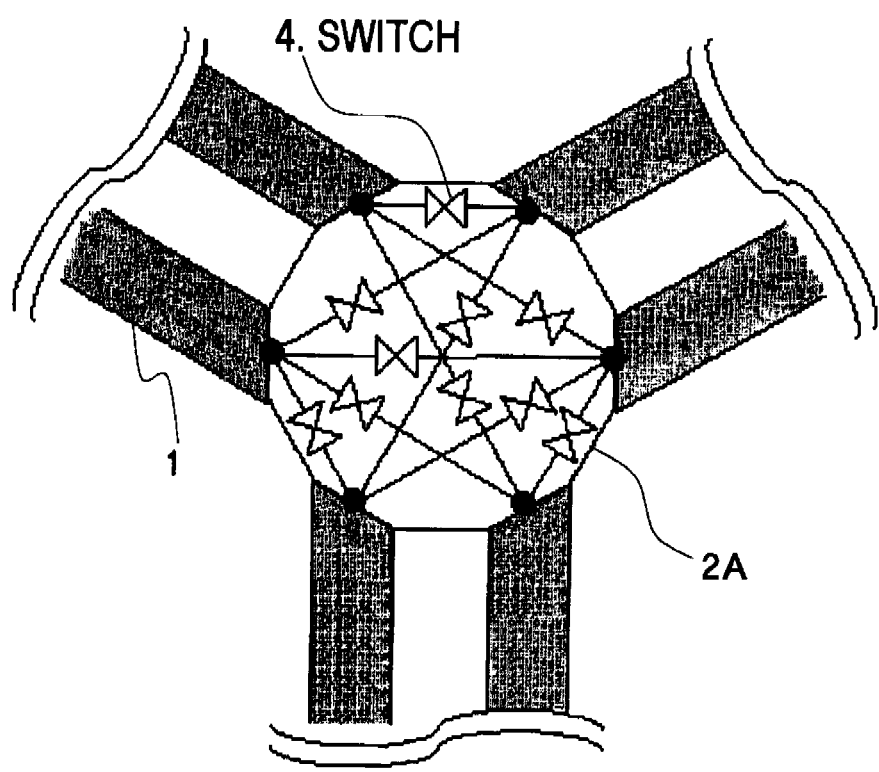
FIG. 2 is a circuit diagram illustrating on example of a connection-relationship control device 2A shown in FIG. 1.

The first connection-relationship control device 2A is placed between ends of adjacent conductor patterns 1 and, after the chips are stacked, is capable of freely controlling the shorting and opening of these ends of the conductor patterns 1. FIG. 2 shows a circuit diagram as one example of the first connection-relationship control device 2A. As illustrated in FIG. 2, the connection-relationship control device 2A is composed of switches 4. Each switch 4 is implemented by an NMOS transistor, PMOS transistor or transfer gate obtained by combining these transistors, etc. It does not matter that the switch may be an electronic element other than a MOS transistor, such as a bipolar transistor. Examples of electronic elements are a non-volatile memory element that uses a phase-change material and a switch element using a solid electrolytic material that utilizes the deposition of metal ions, etc. Further, the switch can also be constituted by a polysilicon fuse or metal fuse, etc.

FIG. 3 shows schematic views illustrating respective states of connection between conductor patterns by the switches in the connection-relationship control device 2A shown in FIG. 2. On the left side column in each of FIG. 3A through FIG. 3N, shorted switch 4 is indicated by a circle mark. On the right side column, the connection states of the conductor patterns 1 due to the shorted switches are represented by the darkest portion.

Figure 4:
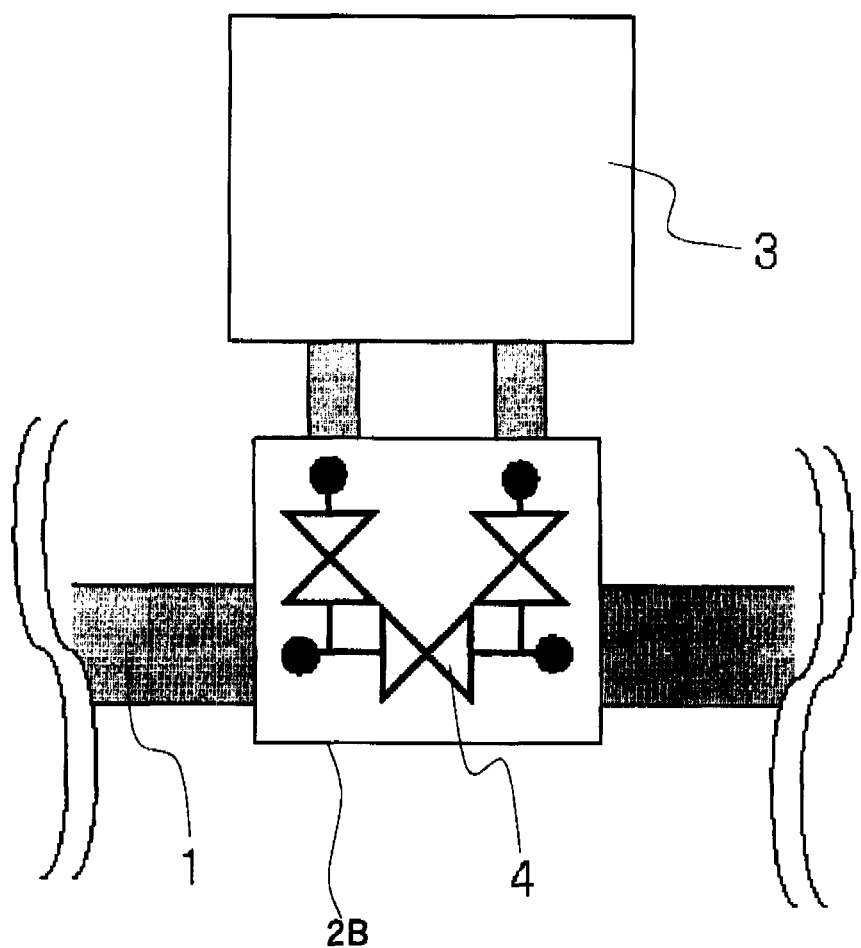
FIG. 4 is a circuit diagram illustrating on example of a connection-relationship control device 2B shown in FIG. 1.

In a manner similar to FIG. 2, FIG. 4 shows a circuit diagram as one example of the second connection-relationship control device 2B. The connection-relationship control device 2B controls the connection between a prescribed conductor pattern 1 and the signal device 3. As illustrated in FIG. 4, the connection-relationship control device 2B, like the first connection-relationship control device 2A, is composed of switches 4.

FIG. 5 shows schematic views illustrating respective states of connection between the conductor patterns 1 and the signal device 3 by the switches in the connection-relationship control device 2B shown in FIG. 4. On the left side column in each of FIG. 5A and FIG. 5B, shorted switches 4 are indicated by a circle mark. On the right side column, the states of connection between the conductor patterns and signal device 3 are represented by the darkest portion.

Figure 6:
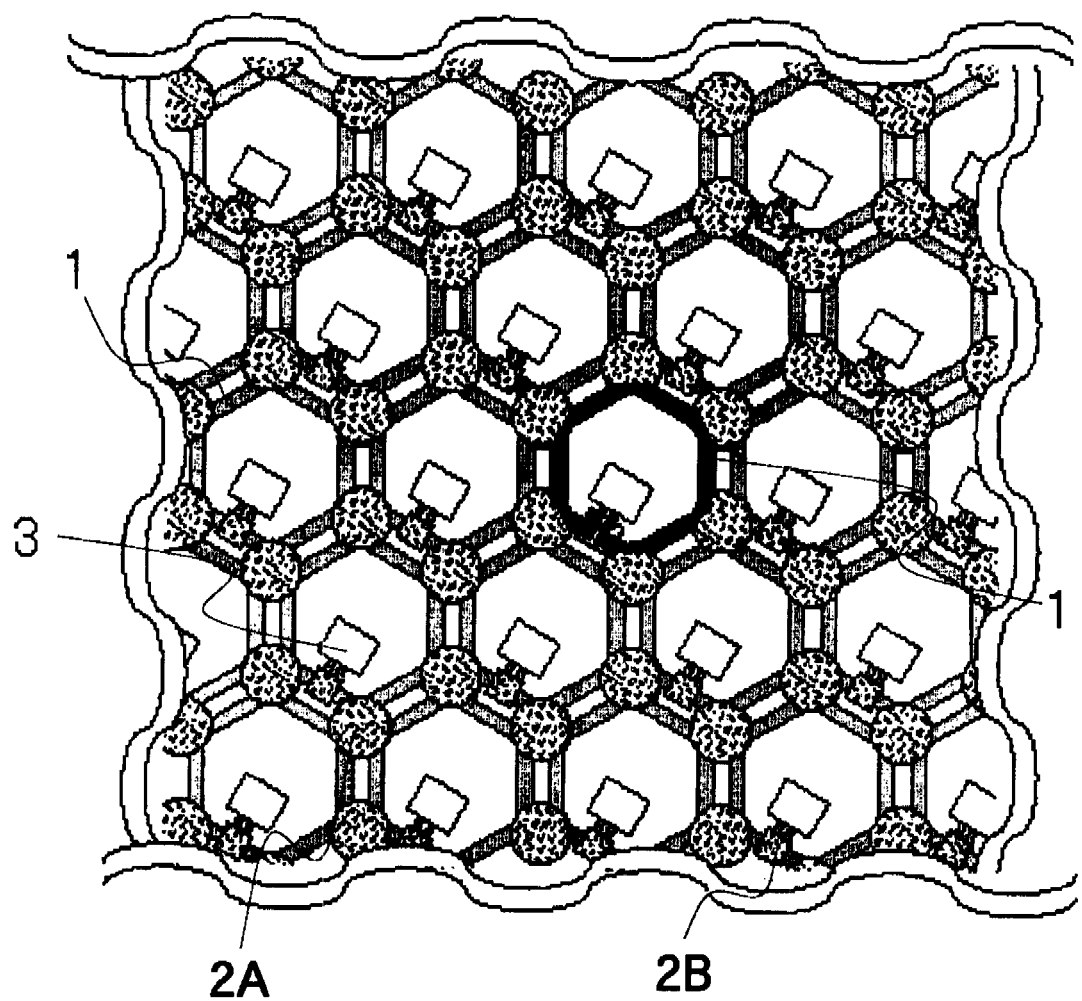
FIG. 6 is a schematic planar view illustrating circumstances when a coil has been formed using connection-relationship control devices 2A, 2B.

FIG. 6 shows, as one example, a schematic planar view when a coil has been formed using the connection-relationship control devices 2A, 2B. As indicated by the darkest portion in FIG. 6, if a loop having the signal device 3 as its starting and end points is formed by the connection-relationship control devices 2A, 2B and a plurality of the conductor patterns 1, operation as a signal transmitting or receiving coil becomes possible.

Control of coil position when chips having the construction set forth above have been stacked will be described next. Described below will be a case where packaging of an upper chip with respect to a lower chip is exactly the same as designed, a case where there is a shift in the vertical direction so that the distance between the chips departs from the design, and a case where the chips have shifted in the horizontal direction. In the description that follows, use will be made of an example in which the receiving coil is fixed and the position and shape of the transmitting coil are varied. However, as a matter of course, similar effects may well be obtained even if the transmitting coils is held fixed and the receiving coil varied. Further, it does not matter even if both the transmitting coil and receiving coil are varied.

Figure 7:
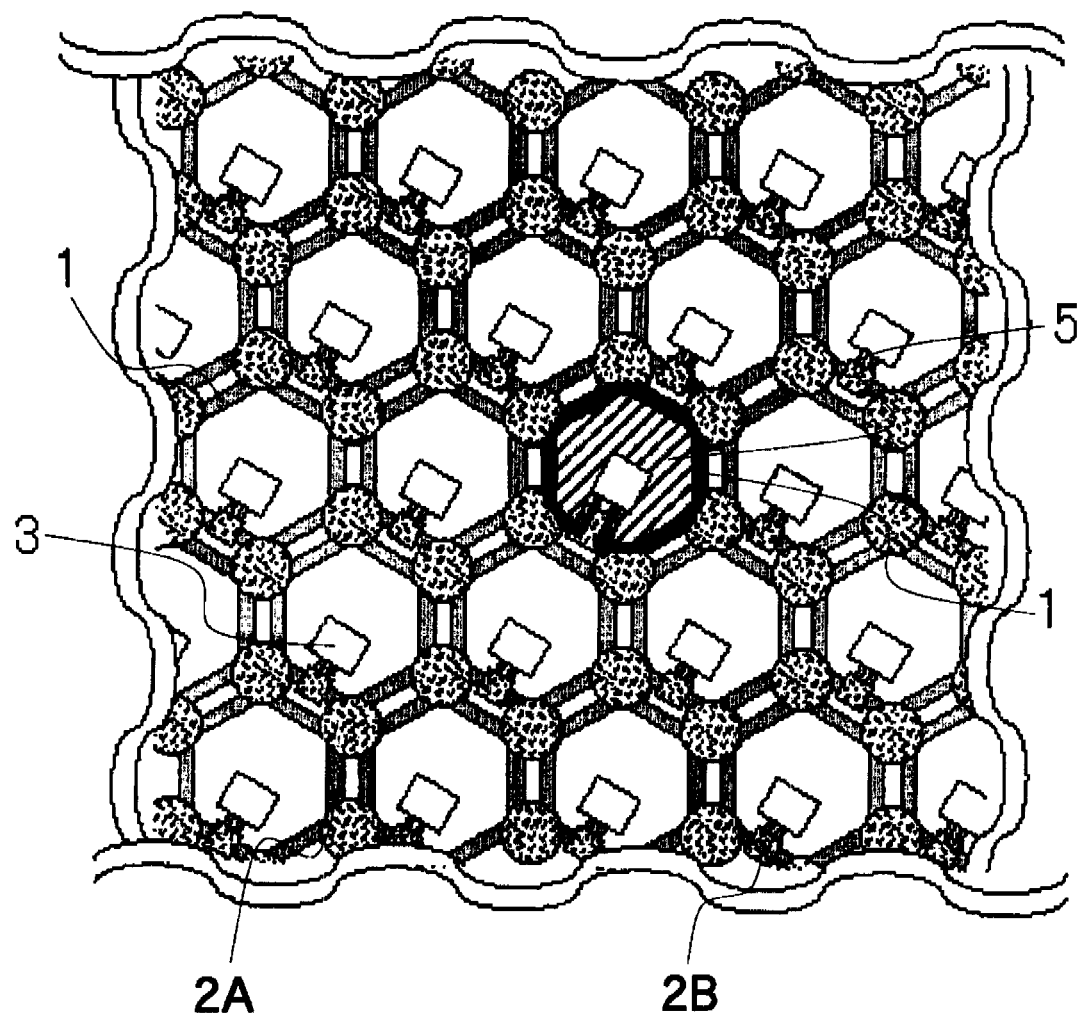
FIG. 7 is a diagram illustrating circumstances when a chip package could be mounted at a position according to supposition.

First, FIG. 7 illustrates a case where a chip package could be mounted at a position according to supposition in each of the horizontal and vertical directions. As illustrated in FIG. 7, the circuitry on the chip is designed beforehand in such a manner that signal reception will be possible using the smallest-unit coils that form a pair. A shaded area 5 is where the receiving coil has been projected upon the chip having the transmitting coil and represents the position of the receiving coil relative to the chip. In the case where the chip mounting position is according to supposition, as depicted in FIG. 7, the projected position of the receiving coil constituting the smallest unit coincides with the position of the transmitting coil constituting the smallest unit. Using a plurality of the smallest-unit coils of the kind shown in FIG. 7 makes it possible to transmit signals in parallel.

Figure 8:
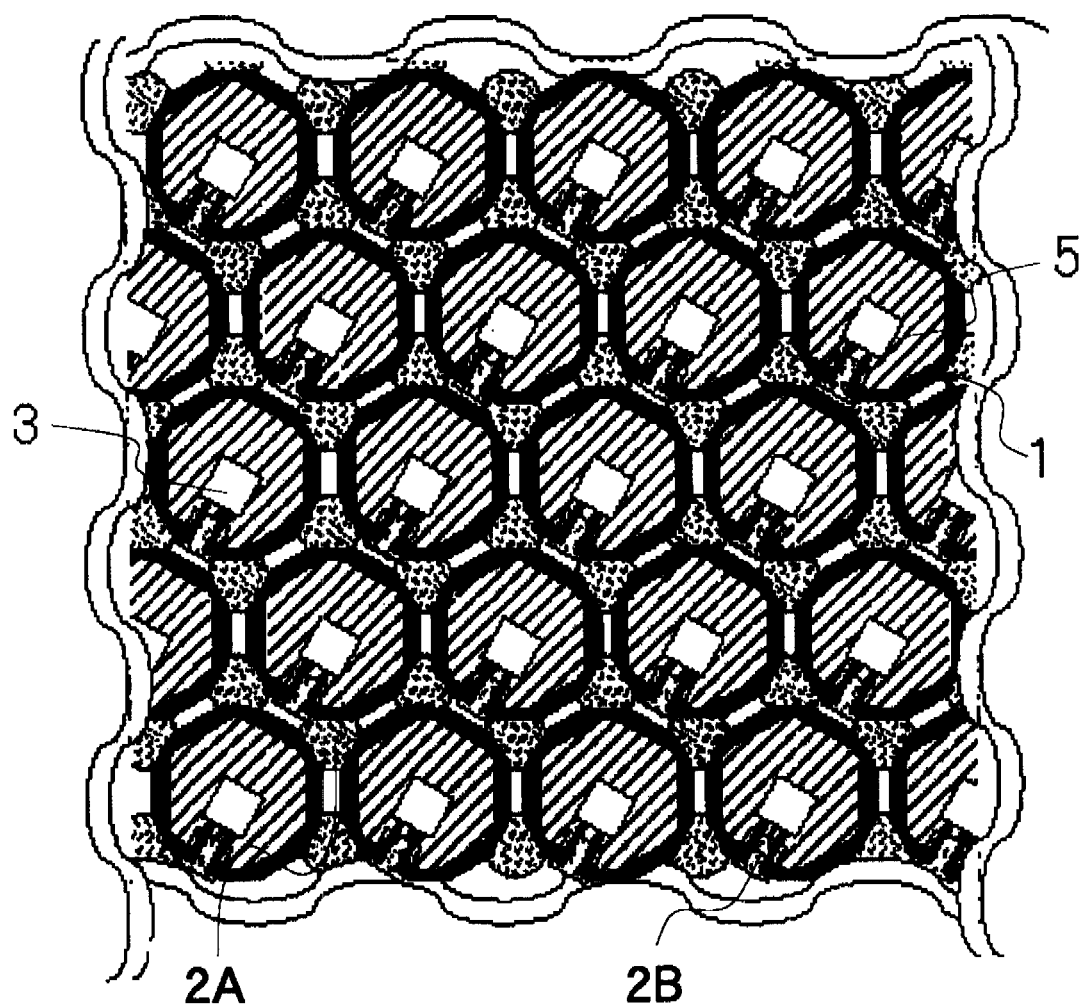
FIG. 8 is schematic planar view of an integrated circuit device in a case where multi-channel transmission is performed.

FIG. 8 is schematic planar view of an integrated circuit device in a case where multi-channel transmission is performed. In the case where the signal transmission speeds between a plurality of transmitting coils and a plurality of receiving coils are the same, as shown in FIG. 8, transmission by a plurality of coils is possible and large-volume signal transmission becomes possible as a result. It should be noted that the darkest portions in FIGS. 7 and 8 indicate smallest-unit coils.

Figure 22:
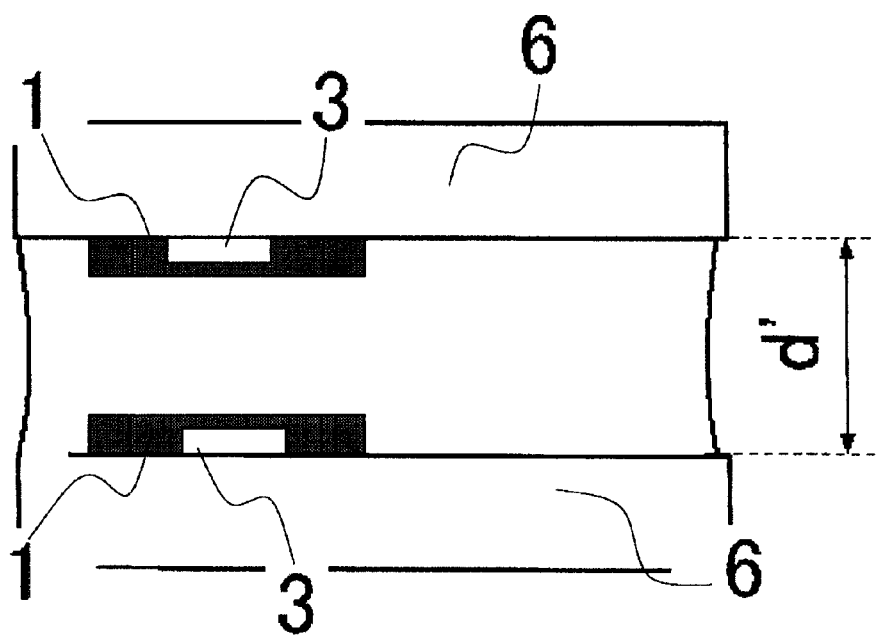
FIG. 22 is a sectional view of an integrated circuit device according to the prior art in a case where distance between chips has shifted.

Discussed next will be a case where only the distance between chips has departed from the supposition, as illustrated in FIG. 22. With the conventional technique, mutual inductance decreases, a sufficient signal strength is not obtained and signal transmission cannot be performed. As indicated by the darkest portions shown in FIG. 9, dual loops each having the signal device 3 as its starting and end points are formed by the connection-relationship control devices 2A, 2B and plurality of conductor patterns 1. As a result, the number of transmitting coil windings is doubled, self-inductance is enlarged and mutual inductance between the coils can be increased.

Figure 9:
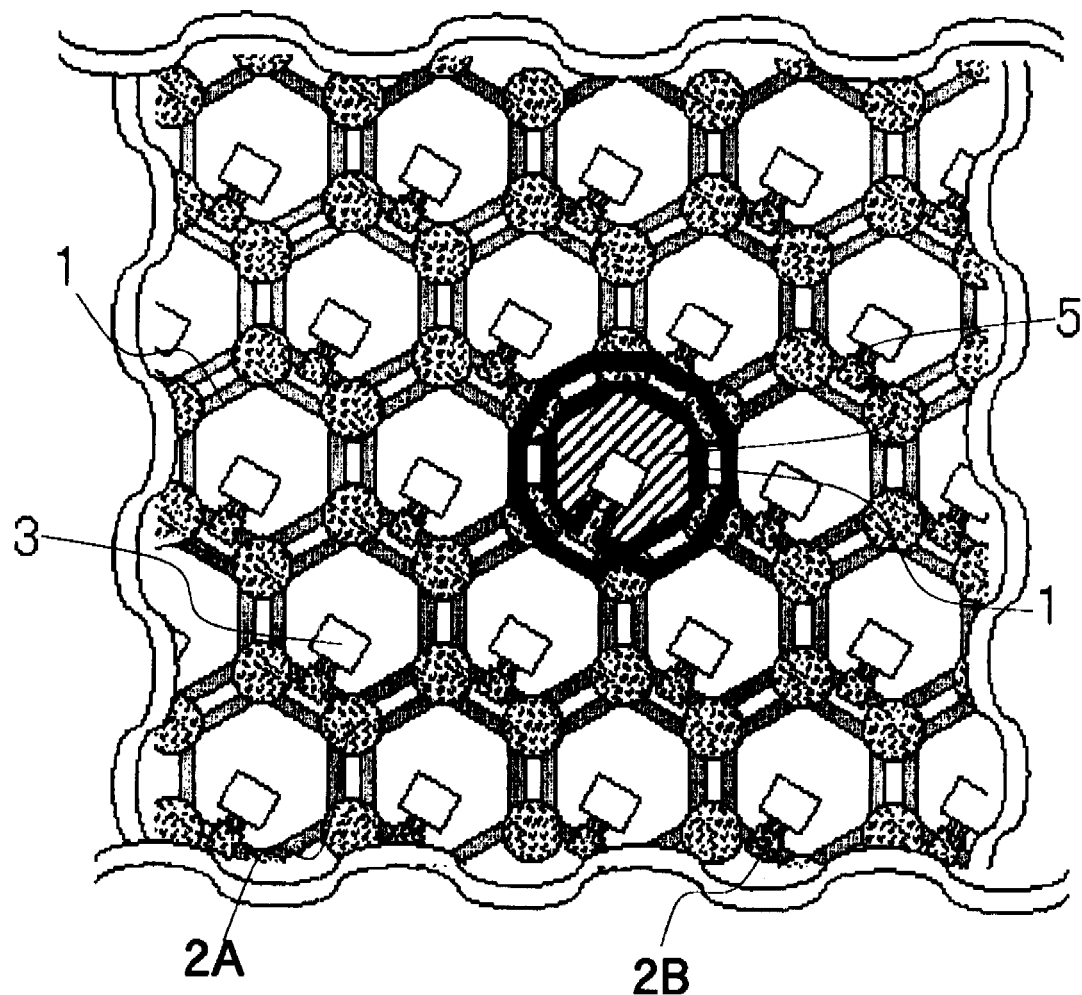
FIG. 9 is schematic planar view illustrating circumstances upon increasing number of coil windings in a case where only distance between chips has departed from the supposition.
Figure 10:
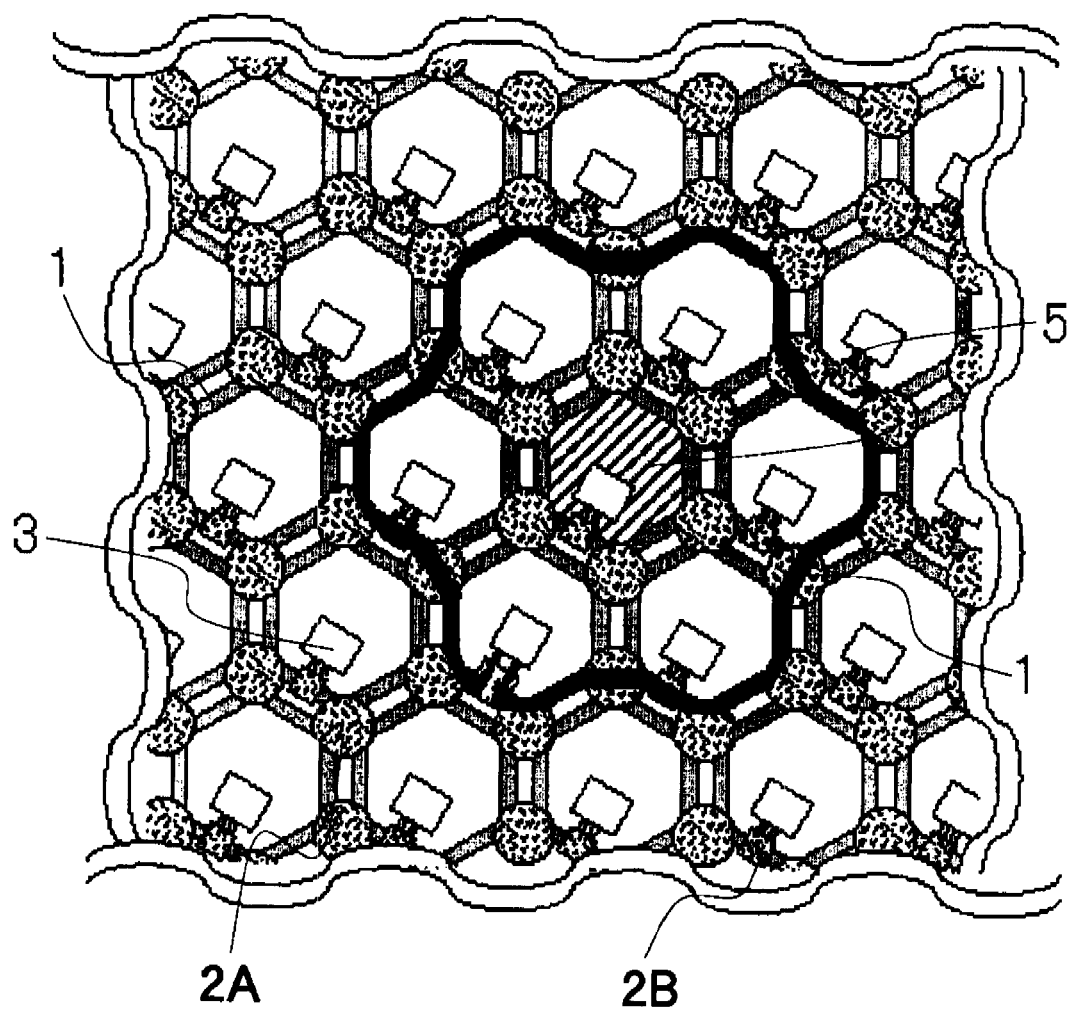
FIG. 10 is schematic planar view of an integrated circuit device in a case where coil diameter has been enlarged.

Although mutual inductance is enlarged by increasing the number of windings in the example of FIG. 9, it is possible to enlarge mutual inductance also by enlarging the coil diameter. FIG. 10 is schematic planar view of an integrated circuit device in a case where coil diameter has been enlarged. As indicated by the darkest portions in FIG. 10, a coil having a diameter larger than that of the smallest-unit coil shown in FIG. 7 can be formed by the connection-relationship control devices 2A, 2B and plurality of conductor patterns 1. As a result, it is possible to enlarge mutual inductance.

Figure 11:
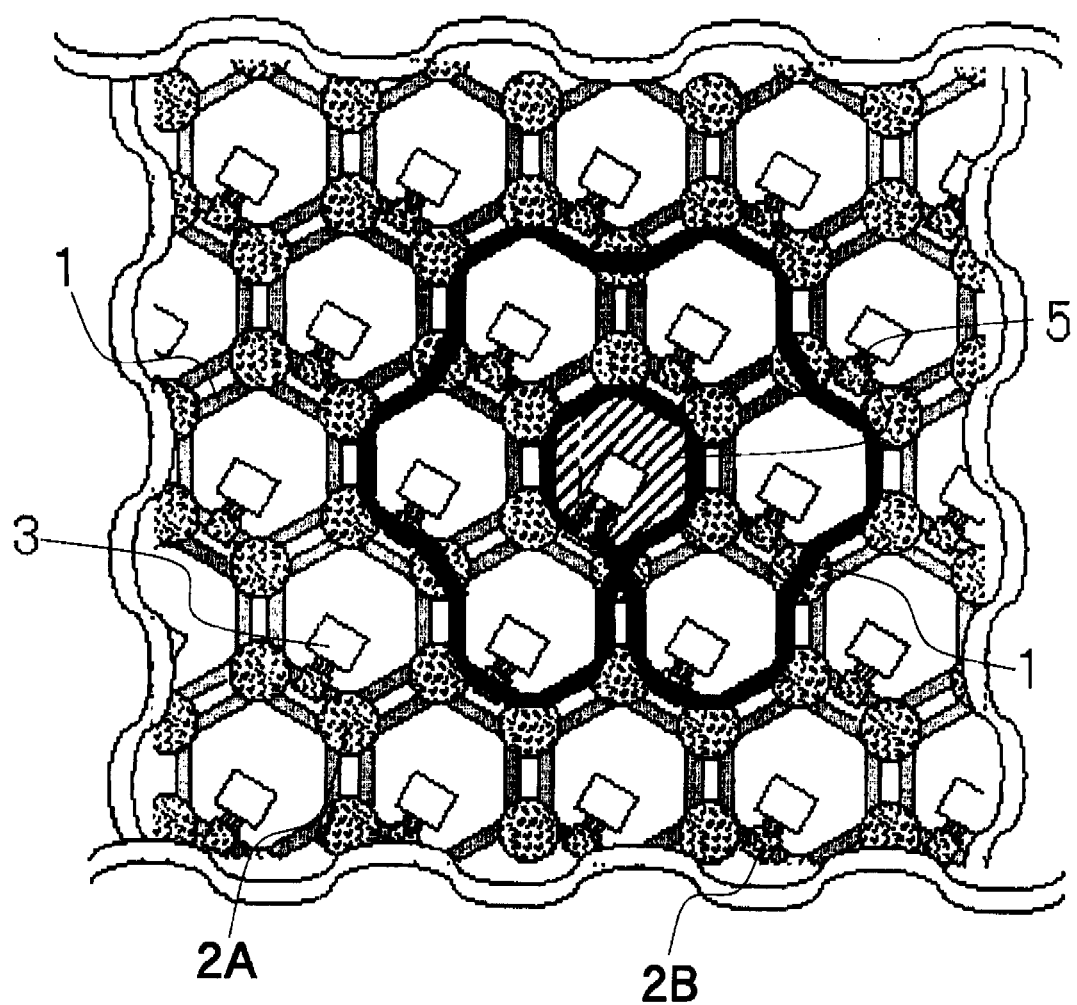
FIG. 11 is schematic planar view of an integrated circuit device in a case where the coil forming methods of FIGS. 7 and 10 have been combined.

In a case where an even larger mutual inductance is required, it is possible to combine a minimum-unit coil and a coil the coil diameter of which has been enlarged as shown in FIG. 10. A schematic planar view of an integrated circuit device in the case of such a combination is illustrated in FIG. 11. As indicated by the darkest portions in FIG. 11, both coil diameter and number of coil windings are increased in comparison with the smallest-unit coil shown in FIG. 7. This makes it possible to achieve a larger mutual inductance.

Figure 12:
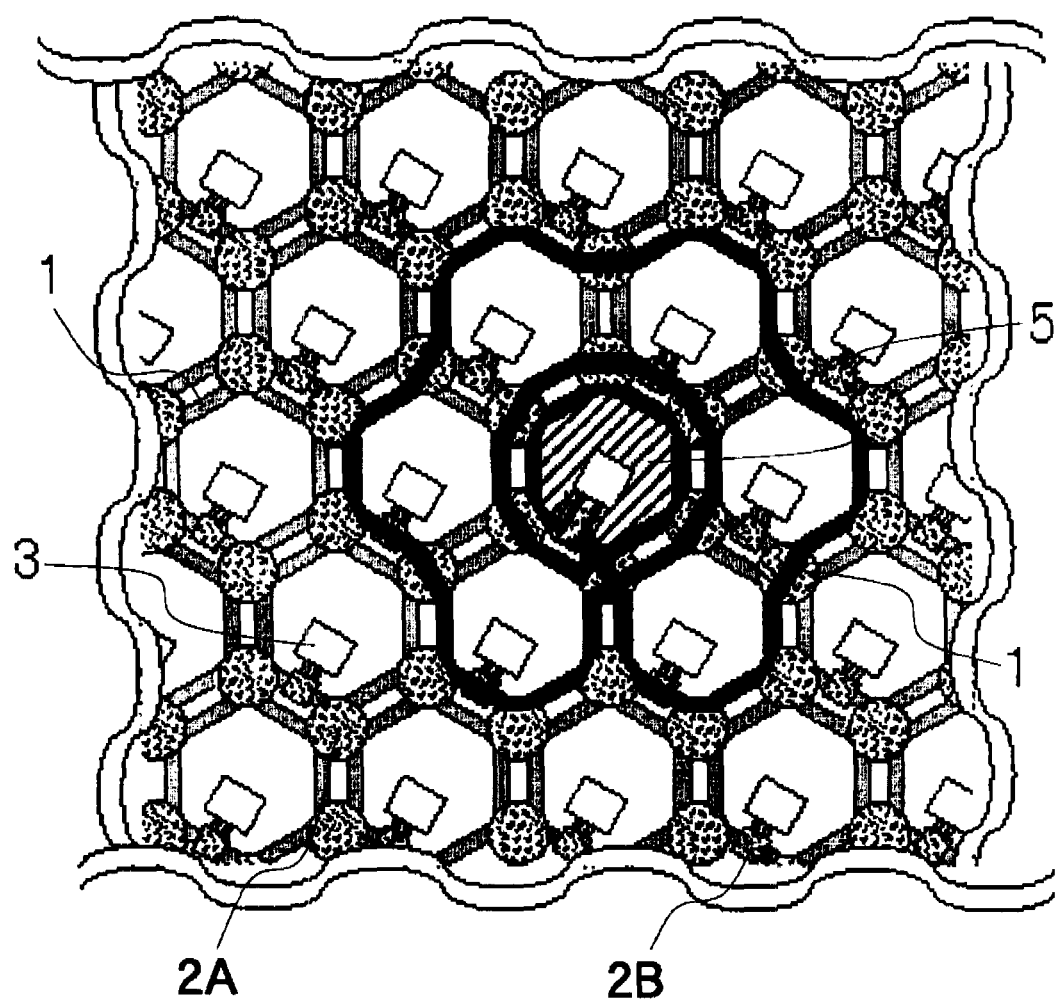
FIG. 12 is schematic planar view of an integrated circuit device in a case where the coil forming methods of FIGS. 9 and 11 have been combined.

In a case where a still larger mutual inductance is required, it is possible to combine the coil shown in FIG. 9 and the coil shown in FIG. 10. A schematic planar view of an integrated circuit device in the case of such a combination is illustrated in FIG. 12. As indicated by the darkest portions in FIG. 12, the number of coil windings is increased over the coil shown in FIG. 11. This makes it possible to achieve an even larger mutual inductance.

Thus, by switching the connection relationships of the conductor patterns 1 in various combinations after chip packaging, it is possible to select a coil configuration suited to signal transmission.

Figures 24A, 24B:
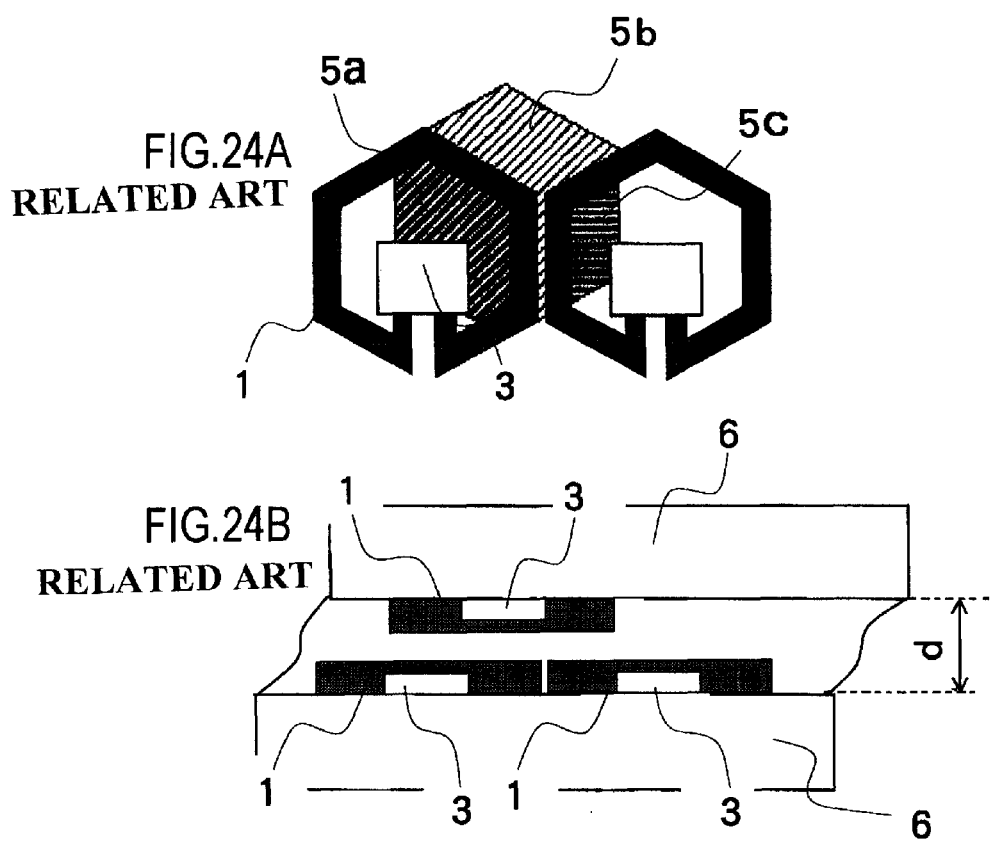
FIG. 24 is a planar projection and sectional view of an integrated circuit device according to the prior art in a case where a coil adjacent to a chip that has shifted in the horizontal direction exists.

Discussed next will be a case where chip mounting position has shifted in the horizontal direction, as illustrated in FIG. 23. With the conventional technique, the directions of magnetic flux passing by the receiving coil are opposite from each other in areas 5a and 5b, as illustrated in FIG. 23, and mutual inductance declines. As a result, sufficient signal strength is not obtained and signal transmission can no longer be performed. Further, in a case where an adjacent coil exists, as shown in FIG. 24, the signal from the adjacent coil leaks out in an area 5c and crosstalk occurs. In a case where a satisfactory S/N ratio cannot be assured at this time, erroneous transmission of signals occurs. In order to carry out a high-quality signal transmission, magnetic flux in one direction only must enter the receiving coil.

Figure 13:
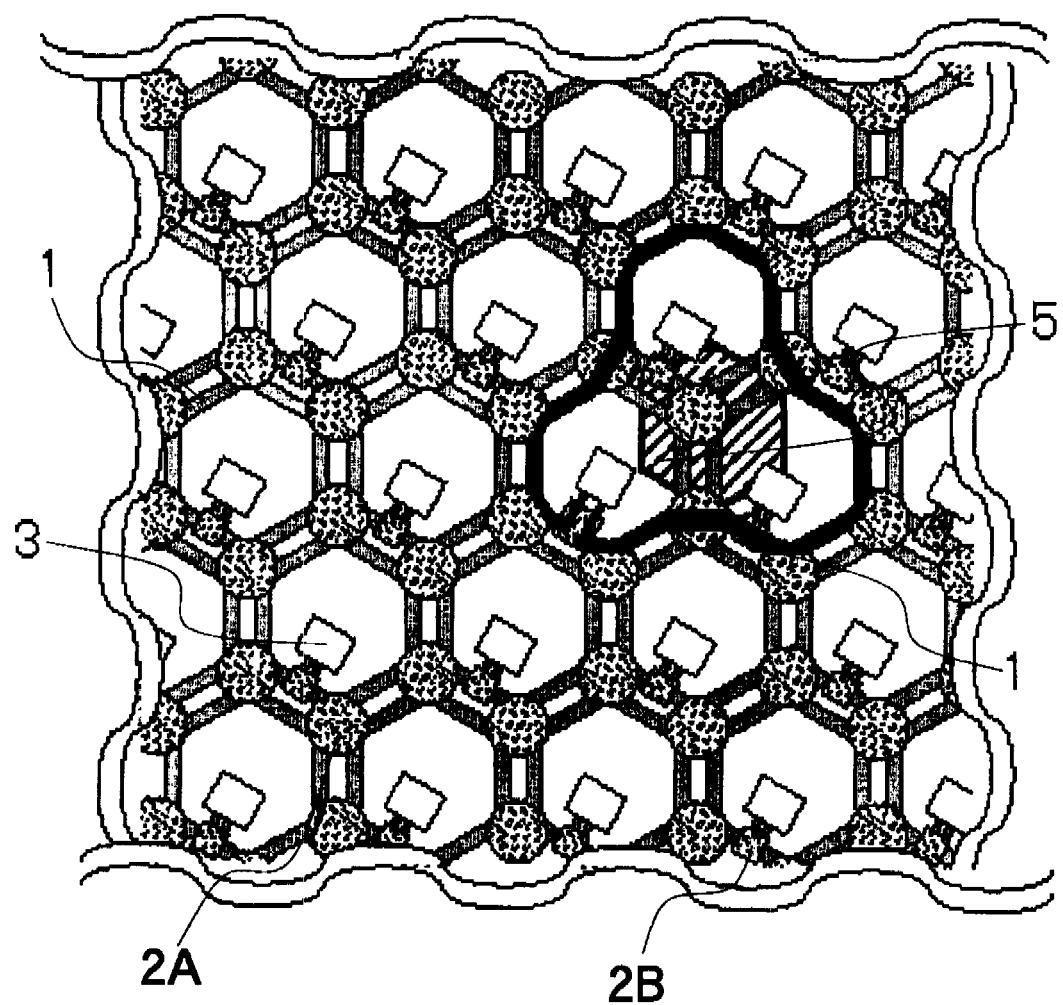
FIG. 13 is schematic planar view illustrating a coil shape for allowing a shift in chip position in the horizontal direction.

Accordingly, FIG. 13 is schematic planar view in a case where a coil shape for allowing a shift in chip position in the horizontal direction is realized. In FIG. 13, that darkest portion is the transmitting coil and the shaded area 5 is the receiving coil. As illustrated, the entirety of the receiving coil is inside the transmitting coil. As a result, magnetic flux in only one direction enters the receiving coil and it is considered that the mutual inductance necessary for signal transmission can be assured.

If mutual inductance is small and signal strength not obtained, it will suffice to acquire the signal strength by combining the coil shape shown in FIG. 13 and a method of the kind shown in FIGS. 9 to 12.

In the embodiment described above, the form of the circuit on the chip is one in which regular hexagons are arranged without gaps between them (the form of a so-called hexagonal lattice), as illustrated in FIG. 1. In FIG. 1, the connection-relationship control device 2A is placed at each crosspoint (each vertex) of this hexagonal lattice, and two of the conductor patterns 1 are disposed on each of the sides of the hexagonal lattice. Furthermore, disposed on one of the two conductor patterns 1 placed on one side of the hexagonal lattice is the connection-relationship control device 2B, which controls the connection between this conductor pattern 1 and the input and output terminals of the signal device 3.

By connecting desired conductor patterns, from among the number of conductor patterns 1 disposed on the chip as shown in FIG. 1, using the connection-relationship control devices 2A, 2B so as to form a loop, it is possible to form a coil for signal transmission. With such an arrangement, conductor patterns connected by the connection-relationship control devices 2A, 2B can be selected and it is possible to freely set the position, number, diameter and number of windings of the coil formed on the chip. Accordingly, high-quality signal transmission can be realized by adjusting coil position, mutual inductance between coils and resonance frequency, etc., after the chip is packaged. In other words, in the chip packaging process, a high accuracy is not required for the positional alignment of chips and a change to a coil position and shape suited to high-quality signal transmission can be made after chip packaging.

Figure 14:
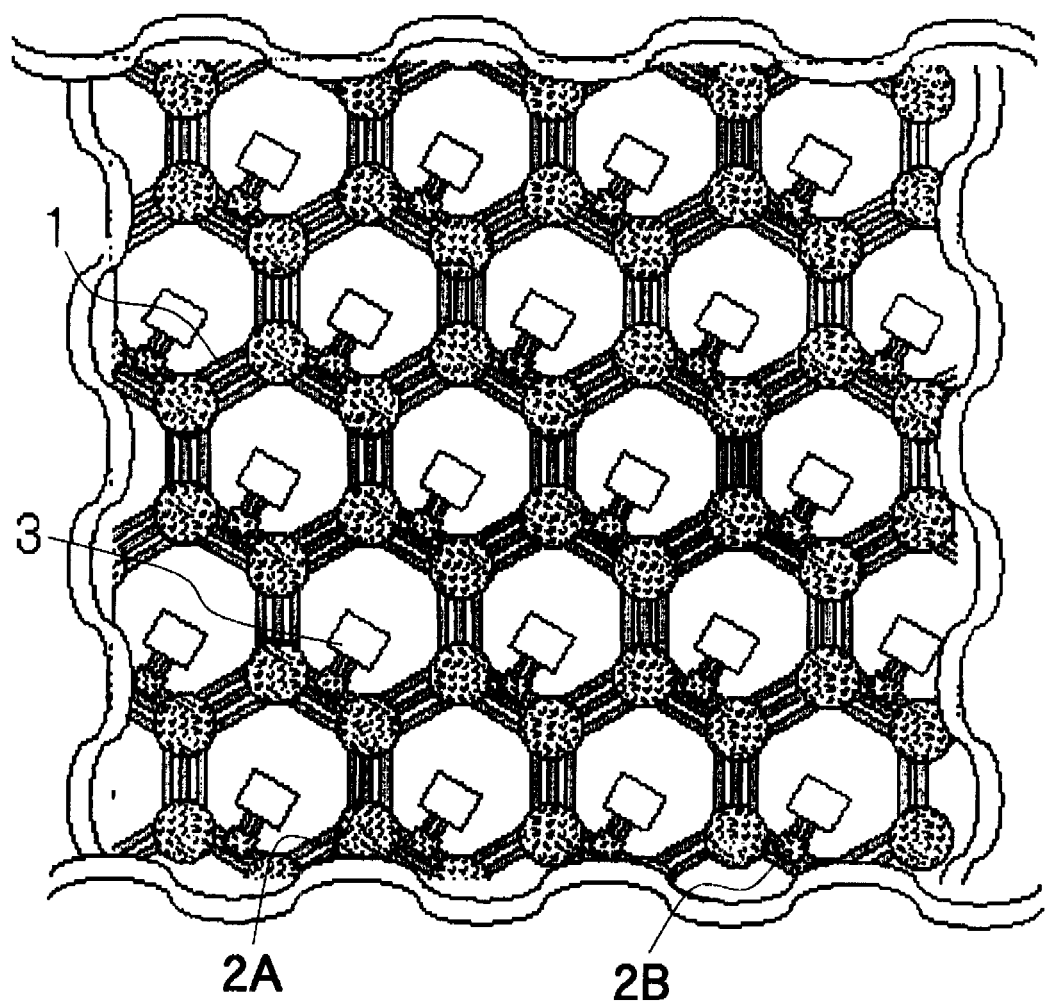
FIG. 14 is a diagram illustrating a circuit in which each side of a hexagonal lattice is constituted by three conductor patterns.

It should be noted that in the foregoing embodiment, two of the conductor patterns 1 are disposed on each side of the hexagonal lattice. However, the conductor patterns 1 on each side need not be two; three or more of the conductor patterns 1 may be disposed. FIG. 14 illustrates a circuit in which each side of a hexagonal lattice is constituted by three of the conductor patterns 1.

Figure 15:
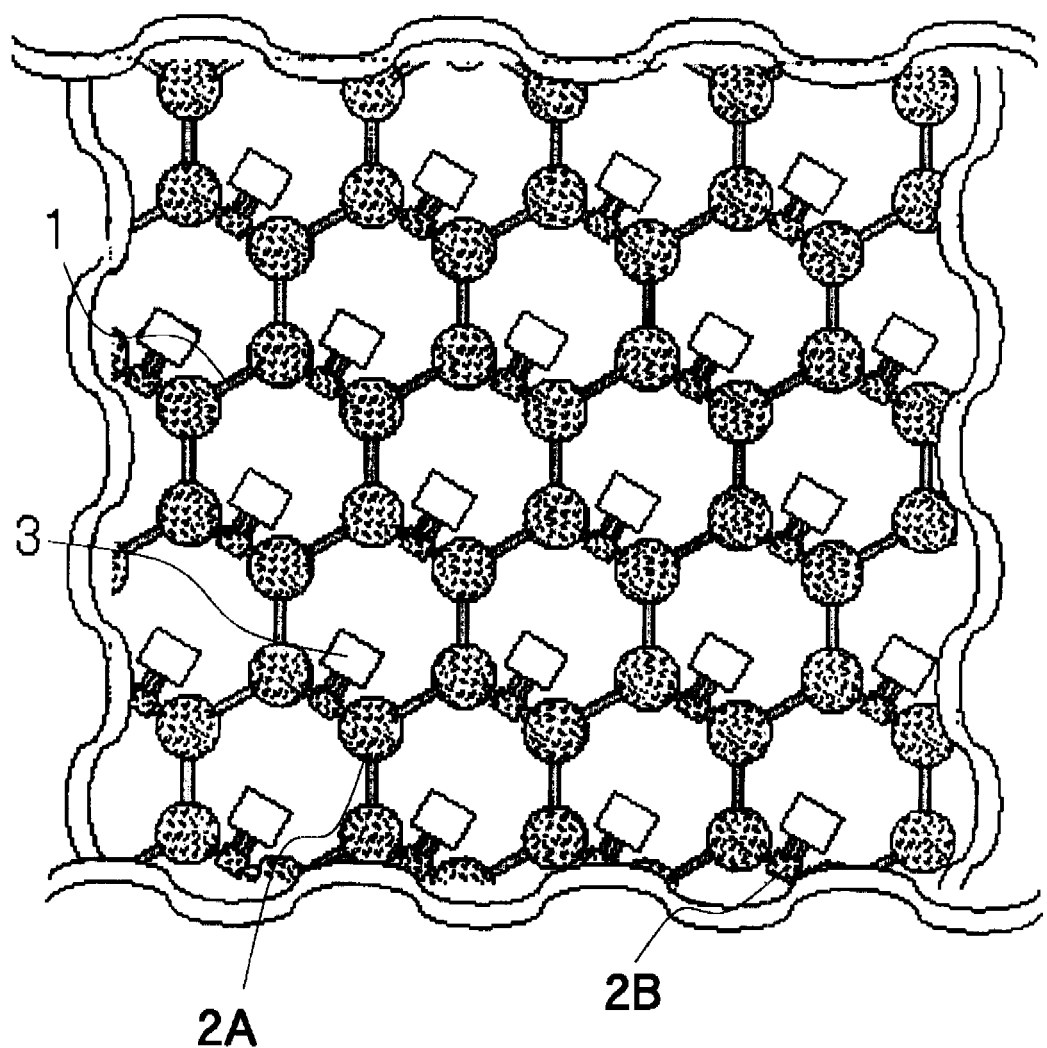
FIG. 15 is a diagram illustrating a circuit in which each side of a hexagonal lattice is constituted by a single conductor pattern.

Further, it is permissible for a single conductor pattern 1 to be placed on each side of the hexagonal lattice, as illustrated in FIG. 15. However, since formation of coils can no longer be performed at adjacent positions as with the plurality of coils indicated by the darkest portions shown in FIG. 16, note should be taken of the fact that the density of I/O portions declines.

Figure 16:
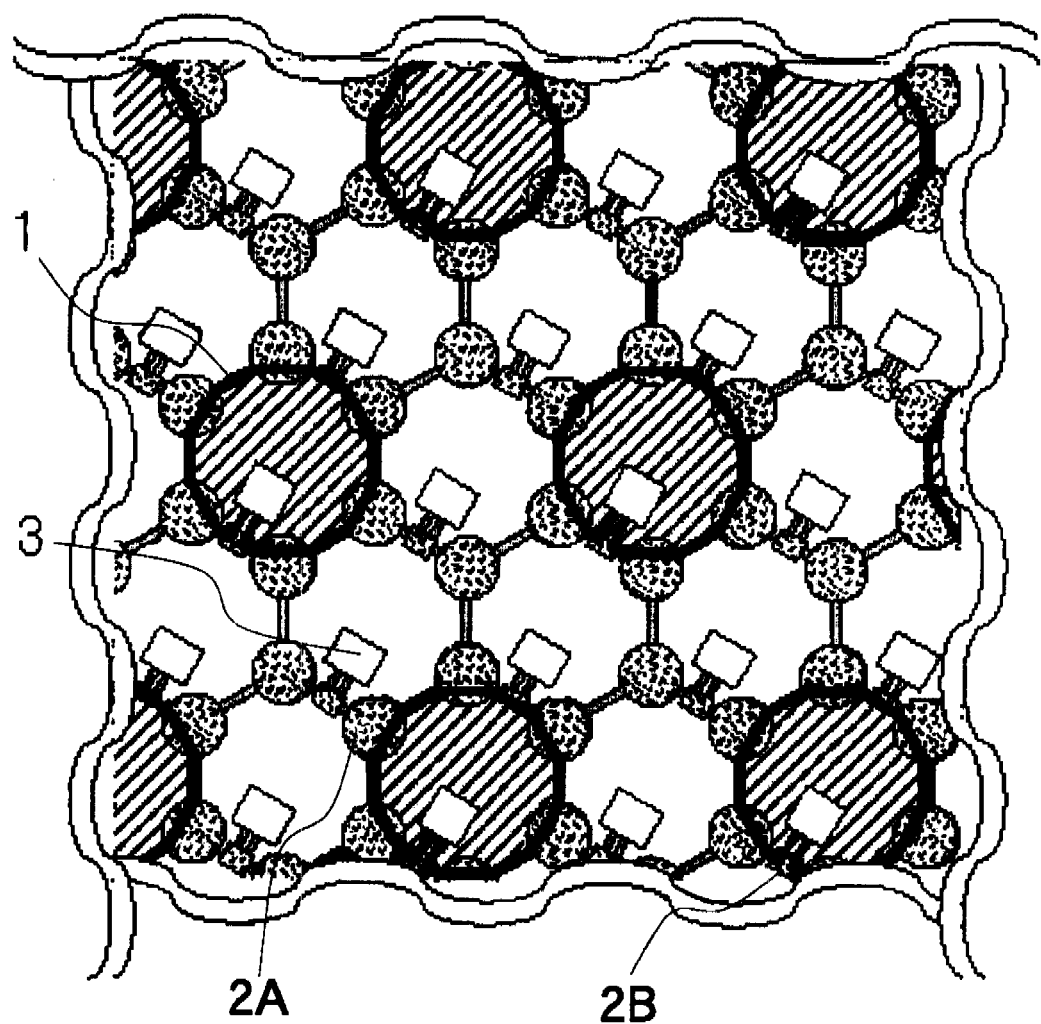
FIG. 16 is schematic planar view illustrating circumstances when a plurality of coils have been formed in the circuit shown in FIG. 15.

A case where the conductor patterns 1 placed on a chip have been fabricated in a single wiring layer is illustrated as the form described above. However, it is not necessary to form a coil in a single wiring layer, and it does not matter if the conductor patterns 1 for the coil are formed using a plurality of wiring layers. An enlarged planar view of a coil conductor portion in a case where a single wiring layer is used is illustrated in FIG. 17A, a sectional view taken along a-a' is shown in FIG. 17B, and a sectional view of a coil conductor portion in a case where a plurality of wiring layers are used is depicted in FIG. 17C. By thus utilizing a plurality of wiring layers, it is possible to change the number of coil windings to a greater degree and it becomes possible to avoid the problem wherein coils cannot be formed adjacent to one another as illustrated in FIG. 16.

Furthermore, the foregoing illustrates an example in which the conductor patterns 1 are arranged in the form of a hexagonal lattice. However, the arrangement of the conductor patterns 1 need not be that of a hexagonal lattice, and it will suffice if a loop-like structure can be formed by the plurality of conductor patterns 1 and connection-relationship control devices 2A, 2B.

However, it should be noted that placing the conductor patterns 1 on the sides of a hexagonal lattice as shown in FIG. 1 is optimum from the standpoint of achieving a desired coil shape and coil diameter efficiently.

Figure 18:
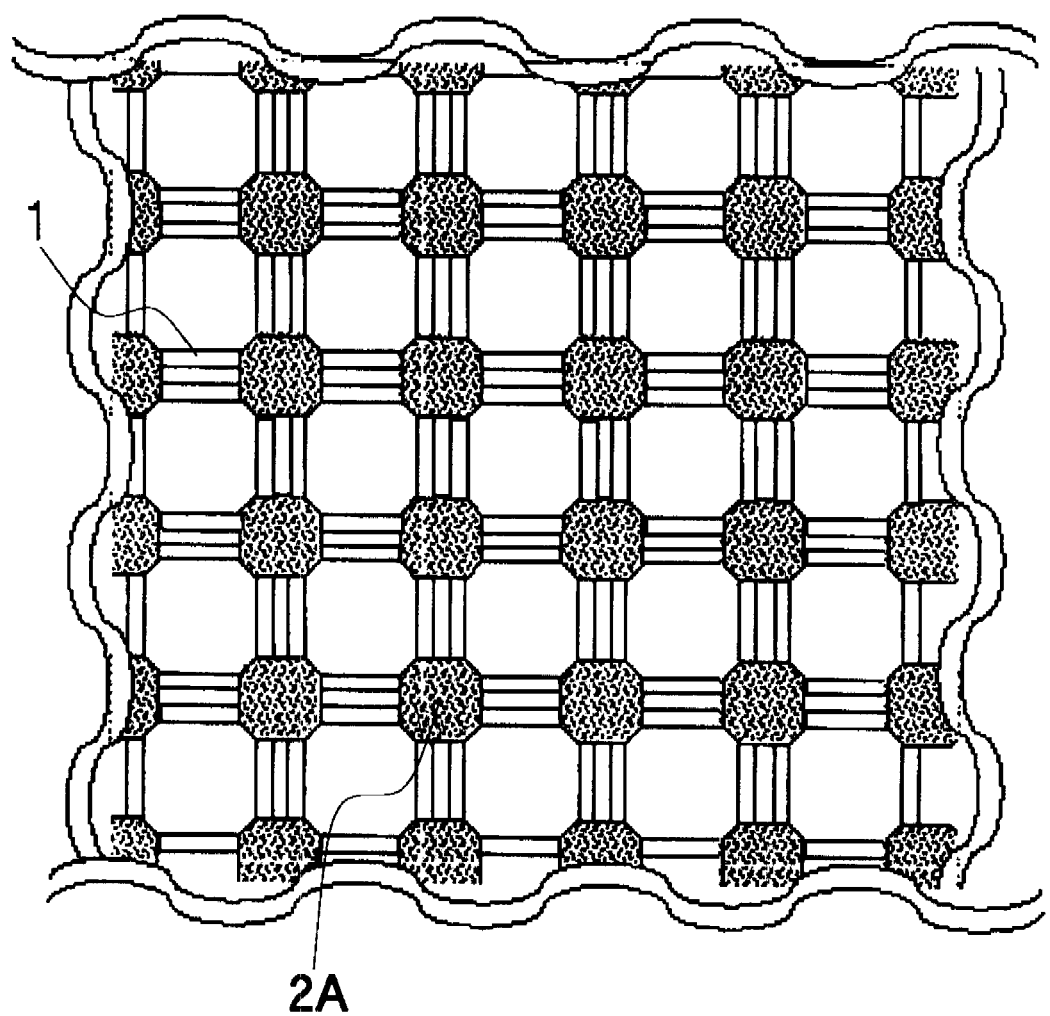
FIG. 18 is schematic planar view illustrating an example of layout of conductor patterns in the shape of a square lattice.
Figure 19:
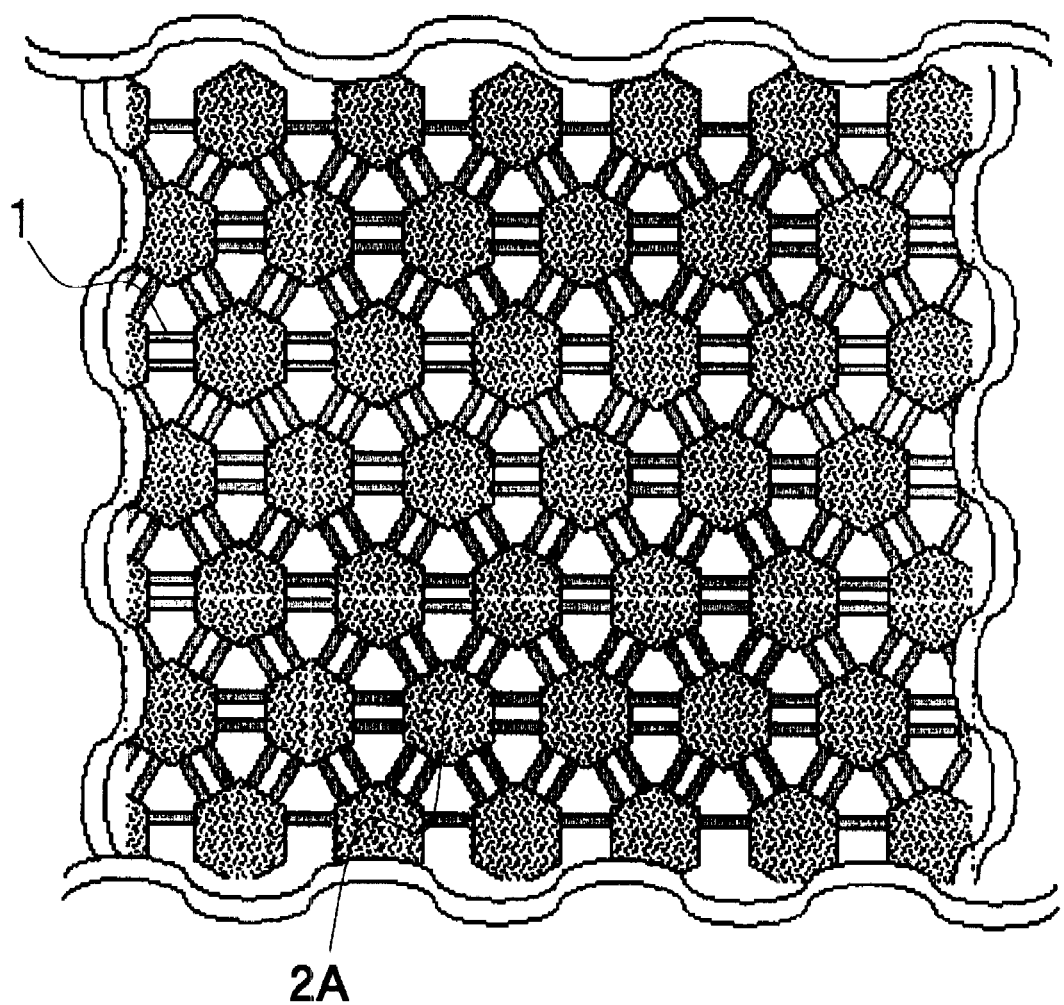
FIG. 19 is schematic planar view illustrating an example of layout of conductor patterns in the shape of a triangular lattice.
Figure 20:
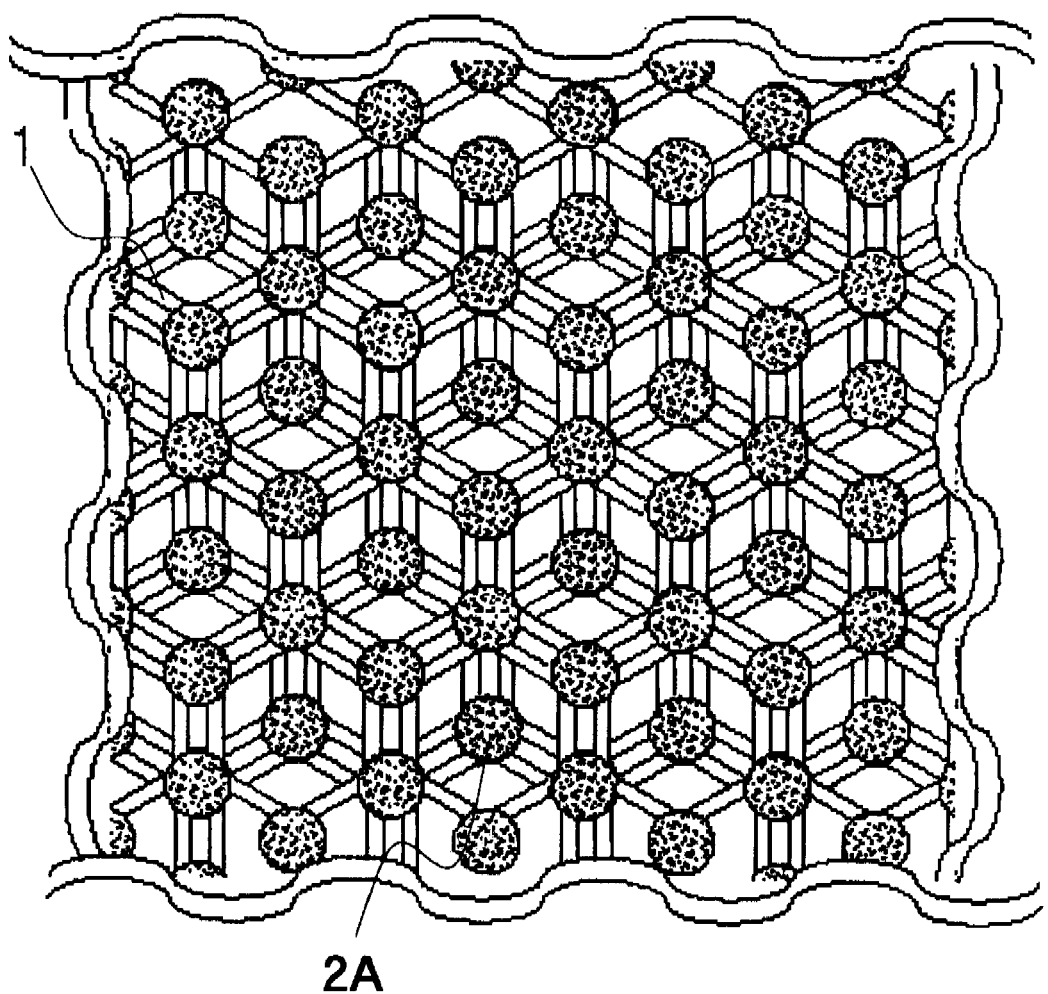
FIG. 20 is schematic planar view illustrating an example of layout of conductor patterns in the shape of a rhomboid lattice.
Figures 21A, 21B:
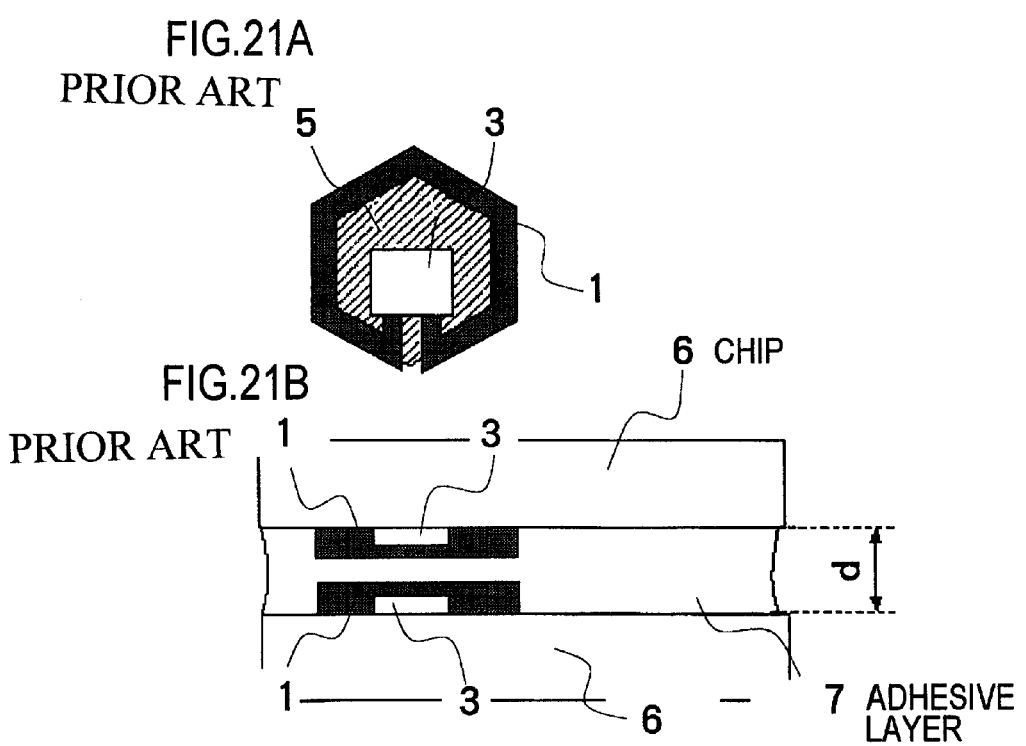
FIG. 21 is a planar projection and sectional view of an integrated circuit device according to the prior art.

Besides the hexagonal-lattice arrangement, a square-lattice arrangement and triangular-lattice arrangement are conceivable. Schematic plan views of these arrangements are illustrated in FIGS. 18 and 19, respectively. Further, the arrangement is not limited to a square-lattice arrangement and may just as well be a quadrangular-lattice arrangement. FIG. 20 illustrates an example in which the conductor patterns 1 have been arranged in the form of a quadrangular lattice. In FIG. 20, the quadrangular lattice is assumed to be a rhomboid lattice. Thus, the circuit of the present invention can be constructed not only with the hexagonal-lattice arrangement but also in the form of other polygonal lattices.

Furthermore, the form of the circuit of the present invention may be that of a lattice (e.g., a reticulate lattice) that is a mixture of a plurality of types of polygons such as triangles, squares and hexagons.

Further, the conductor patterns 1 are not limited to straight lines; they may be bent or curved patterns or patterns comprising any combination of straight lines, bent lines or curves.

A method of deciding a coil shape suited to signal transmission will be described next.

A method of optically detecting a shift in chip mounting position is utilized as this method. First, the relative positions of marks formed on respective chips are measured and a shift in chip mounting position in the horizontal direction is determined. A shift in position in the vertical direction is detected by an optical method in a manner similar to the position in the horizontal direction. Next, a coil shape suited to signal transmission is selected based upon the obtained shift in position and the connection-relationship control devices 2A and 2B are controlled to thereby make possible high-quality signal transmission.

Further, in a case where an element, such as a transistor, for which the connection relationship is changed reversibly is used as the switch 4, an already known signal can be transmitted and the optimum coil shape can be selected based upon the error rate of this signal. Since selection of the optimum shape that utilizes signal error rate in this manner does not require optical detection of a shift in position, it is possible to select the optimum coil shape very easily.

The invention claimed is:

1. A semiconductor device comprising:
   a plurality of polygons are arranged on a substrate with vertices thereof serving as lattice points, so as to fill in a two-dimensional area for inductor formation;
   at least one conductor disposed along a side connecting adjacent lattice points and
   a plurality of switches for each lattice point for on/off controlling connection between conductors on a plurality of sides that meet at the lattice point;
   a signal device that performs reception and/or supply of a current signal; and
   a switch on one side of the polygon for controlling whether or not the conductor disposed along the side is connected to the signal device;
   wherein a planar inductor of any shape and size is able to be constructed within the two-dimensional area by performing on/off control for each of the switches.

2. The semiconductor device according to claim 1, wherein one side of the polygon includes, as the conductor disposed along the side, a first conductor portion and a second conductor portion each having first ends opposing each other and each having second ends that extends to respective ones of two vertices at both ends of the side; and
   the semiconductor device further includes first and second switches for on/off control of connections between the first end of the first conductor portion and the signal device that performs reception and/or supply of a current signal and the first end of the second conductor portion and the signal device that performs reception and/or supply of a current signal, respectively; and
   a third switch for on/off control of the connection between the opposing first ends of the first conductor portion and the second conductor portion.

3. The semiconductor device according to claim 1, wherein the polygon includes regular polygons of one type that are capable of filling a two-dimensional plane.

4. The semiconductor device according to claim 1, wherein the polygons include polygons of a plurality of types that are capable of filling a two-dimensional plane.

* * * * *

UNITED STATES PATENT AND TRADEMARK OFFICE
CERTIFICATE OF CORRECTION

| | | |
|---|---|---|
| PATENT NO. | : 8,633,577 B2 | Page 1 of 1 |
| APPLICATION NO. | : 12/162059 | |
| DATED | : January 21, 2014 | |
| INVENTOR(S) | : Nakagawa et al. | |

It is certified that error appears in the above-identified patent and that said Letters Patent is hereby corrected as shown below:

On the title page, Item [54] and in the Specification, Column 1, Line 1-2, Title: delete "INTEGRATED CIRCUIT DEVICE" and insert -- INTEGRATED CIRCUIT DEVICE HAVING A PLURALITY OF CONDUCTOR PATTERNS FOR FORMING A COIL --

In the Specification

Column 4, Line 3: delete "213" and insert -- 2B --

Signed and Sealed this
Sixteenth Day of September, 2014

Michelle K. Lee
*Deputy Director of the United States Patent and Trademark Office*